(12) United States Patent
Zhang et al.

(10) Patent No.: US 12,212,357 B2
(45) Date of Patent: Jan. 28, 2025

(54) GaAs MONOLITHIC INTEGRATED TERAHERTZ LOW-NOISE COMMUNICATION SYSTEM TRANSCEIVER FRONT-END

(71) Applicant: University of Electronic Science and Technology of China, Sichuan (CN)

(72) Inventors: Bo Zhang, Sichuan (CN); Zhongqian Niu, Sichuan (CN); Xiaobo Yang, Sichuan (CN); Bingli Dai, Sichuan (CN); Yi Hu, Sichuan (CN); Jicong Zhang, Sichuan (CN); Yong Fan, Sichuan (CN); Ke Liu, Sichuan (CN); Zhi Chen, Sichuan (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 369 days.

(21) Appl. No.: 17/873,134

(22) Filed: Jul. 25, 2022

(65) Prior Publication Data
US 2023/0238997 A1   Jul. 27, 2023

(30) Foreign Application Priority Data
Jan. 27, 2022   (CN) .......................... 202210097467.7

(51) Int. Cl.
  *H04B 1/40*   (2015.01)
  *H03D 7/16*   (2006.01)
(52) U.S. Cl.
  CPC .............. *H04B 1/40* (2013.01); *H03D 7/165* (2013.01)
(58) Field of Classification Search
  CPC ......... H01P 1/208; H01P 5/222; H03B 19/10; H03D 7/165; H04B 1/40
  See application file for complete search history.

(56) References Cited

U.S. PATENT DOCUMENTS 8,035,083 B1 * 10/2011 Kozlov .................. G01J 3/108
  250/341.1
8,748,822 B1 * 6/2014 Gerecht ............. G01N 21/3586
  250/339.07

(Continued)

OTHER PUBLICATIONS

Bertrand Thomas, Simon Rea, Brian Moyna, Byron Alderman, and Day Mathson "A 320-360 GHz Subharmonically Pumped Image Rejection Mixer Using Planar Schottky Diodes", IEEE Microwave and Wireless Components Letters, vol. 19, No. 2, Feb. 2009 (Year: 2009).*

*Primary Examiner* — Timothy X Pham
(74) *Attorney, Agent, or Firm* — Andrew D. Fortney; Central California IP Group, P.C.

(57) ABSTRACT

The present disclosure provides a GaAs monolithic integrated terahertz low-noise communication system transceiver front-end, including an intermediate frequency circuit and a terahertz circuit. The terahertz circuit includes a local oscillator frequency tripler, a local oscillator unidirectional 3 dB filter coupler, a radio frequency 180° filter coupler, and two terahertz GaAs monolithic integrated subharmonic mixers. The local oscillator unidirectional 3 dB filter coupler and the radio frequency 180° filter coupler each include one ring-cylindrical resonant cavity and four rectangular waveguides. The ring-cylindrical resonant cavity is divided into four rectangular waveguides which are correspondingly connected to the four sector-annular resonant cavities, respectively. The present disclosure suppresses the local oscillator noise by adopting a local oscillator unidirectional 3 dB filter coupler and a radio frequency 180° filter coupler with both coupling and filtering functions, thereby achieving a low local oscillator noise transceiver front-end.

7 Claims, 5 Drawing Sheets

(56) References Cited

U.S. PATENT DOCUMENTS

| | | | | |
|---|---|---|---|---|
| 2009/0065696 A1* | 3/2009 | Mann | ............... | H04B 1/40 |
| | | | | 250/339.02 |
| 2020/0201946 A1* | 6/2020 | Zhang | ............... | G06F 30/00 |
| 2022/0109241 A1* | 4/2022 | Li | ............... | H03D 9/02 |
| 2023/0344385 A1* | 10/2023 | Deng | ............... | H03B 1/00 |

* cited by examiner

FIG. 6

GaAs MONOLITHIC INTEGRATED TERAHERTZ LOW-NOISE COMMUNICATION SYSTEM TRANSCEIVER FRONT-END

CROSS REFERENCE TO RELATED APPLICATIONS

This application claims priority to Chinese Patent Application No. 202210097467.7 filed Jan. 27, 2022, the disclosure of which is herein incorporated by reference in its entirety.

FIELD

The present disclosure relates to the technical field of terahertz wireless communication, and more particularly to a GaAs monolithic integrated terahertz low-noise communication system transceiver front-end.

BACKGROUND

With the increasing development of high-speed interconnection applications in spatial networking, wireless communication is faced with the contradiction between limited spectrum resources and rapidly growing demands for high-speed services, which puts forward an urgent need for the development of a novel high-speed communication technology. The technology aiming at development of broadband large capacity wireless information transmission is the primary key technology for future communication systems.

Terahertz waves are in transition between macroelectronics and microscopic photonics, have characteristics different from microwaves and light waves, and are of a new frequency band that is yet to be developed and needs to be fully explored in the electromagnetic spectrum. In the recent two decades, terahertz science has become the focus of the electromagnetic field worldwide, and is recognized by the international scientific and technological community as a cutting-edge technology field with great scientific value and strategic needs. The terahertz waves are between the microwave millimeter waves and infrared visible light which are relatively mature in technology. The terahertz waves are integrated with the advantages of the microwaves and the infrared visible light and have rich frequency band resources and large bandwidth. The terahertz wireless communication technology not only can meet the needs of short-range and large capacity communication on the ground, but also can be used in spatial communication, signal detection, and other aspects. The development of the terahertz wireless communication technology has an important practical application value and broad application prospects. Therefore, terahertz high-speed wireless communication is an inevitable trend in the development of communication technologies, is the most effective way to implement next generation of real-time transmission of massive data, and is an important technical foundation for information science and technology and a new generation of the information industry.

In various application scenarios, a terahertz signal receiving technology is a component of great importance in a terahertz system. The performance of a mixer, as one of the key components of a transceiver, has an important impact on the entire system. Especially in the terahertz band, due to lack of a low-noise amplifier, the mixer is usually used as a first-stage circuit of a transceiver front-end, and the performance of the mixer directly determines noise performance of the transceiver front-end.

At present, a terahertz solid-state electronic communication system under research is still faced with many technical problems such as poor noise performance of the transceiver front-end, poor circuit consistency, and difficulty in integration and miniaturization. The poor noise performance is mainly caused by the fact that a local oscillator drive source of a transceiver front-end mixer adopts a multiple frequency multiplication method, and the number of frequency multiplications is often greater than ten, which greatly deteriorates the noise performance of the transceiver front-end. The size of a terahertz circuit is small, and if circuits are simply integrated, although the volume of the system can be reduced to achieve portability, reduction in the volume increases the difficulty of processing, mutual interference between the circuits also increases, and therefore a reasonable circuit architecture is very important. The present disclosure is oriented to the application in a high-speed communication system in the future, and focuses on breaking through the technology of terahertz low-noise communication system transceiver front-ends.

SUMMARY

In view of the above-mentioned problems in the existing technology, the present disclosure provides a GaAs monolithic integrated terahertz low-noise communication system transceiver front-end, to solve the inherent problem of noise performance deterioration of a transceiver front-end caused by a plurality of frequency multiplications of a local oscillator drive source.

The specific technical solutions of the present disclosure are as follows:

Provided is a GaAs monolithic integrated terahertz low-noise communication system transceiver front-end, including an intermediate frequency circuit and a terahertz circuit arranged up and down, where the terahertz circuit includes a local oscillator frequency tripler, a local oscillator co-directional 3 dB filter coupler, a radio frequency 180° filter coupler, and two terahertz GaAs monolithic integrated subharmonic mixers;

the local oscillator co-directional 3 dB filter coupler and the radio frequency 180° filter coupler each include one ring-cylindrical resonant cavity and four rectangular waveguides, a height and a ring width of the ring-cylindrical resonant cavity are respectively equal to a long edge size and a short edge size of each of the rectangular waveguides, and an annular surface on both sides of the ring-cylindrical resonant cavity is provided with four corresponding sector-annular grooves, so that the ring-cylindrical resonant cavity is divided into four sector-annular resonant cavities including one big sector-annular resonant cavity and three small sector-annular resonant cavities, and a central angle of the big sector-annular resonant cavity is twice that of each small sector-annular resonant cavity; the four rectangular waveguides are correspondingly connected to the four sector-annular resonant cavities, respectively;

the local oscillator co-directional 3 dB filter coupler takes a rectangular waveguide of the four rectangular waveguides that is connected to the big sector-annular resonant cavity as an isolation end, and the radio frequency 180° filter coupler takes the rectangular waveguide that is connected to the big sector-annular resonant cavity as an input end;

radio frequency signals are filtered and coupled by the radio frequency 180° filter coupler into two signals, which respectively enter the corresponding terahertz GaAs monolithic integrated subharmonic mixers; a local oscillator signal is tripled by the local oscillator frequency tripler, and then inputted to the local oscillator co-directional 3 dB filter coupler, to be filtered and coupled into two local oscillator drive signals, which respectively enter the corresponding terahertz GaAs monolithic integrated subharmonic mixers to drive frequency mixing; and intermediate frequency components generated after the frequency mixing by the two terahertz GaAs monolithic integrated subharmonic mixer are separately inputted to the intermediate frequency circuit, 180° coupled and amplified, to output an intermediate frequency signal with local oscillator noise suppressed.

Further, the intermediate frequency circuit and the terahertz circuit are connected by two low-loss probes.

Further, a groove depth of the sector-annular groove does not exceed ⅓ of the long edge size of each of the rectangular waveguides, and a distance between two end points of an outer arc of the sector-annular groove does not exceed the short edge size of each of the rectangular waveguides.

Further, the rectangular waveguides connected to the small sector-annular resonant cavities each are connected to a center of an outer arc of the corresponding small sector-annular resonant cavity.

Further, the rectangular waveguide connected to the big sector-annular resonant cavity is connected to a ¼ section of an outer arc of the big sector-annular resonant cavity.

Further, the intermediate frequency circuit includes an intermediate frequency 180° hybrid ring and an intermediate frequency low-noise amplifier arranged in sequence, and the intermediate frequency components generated after the frequency mixing by the two terahertz GaAs monolithic integrated subharmonic mixers are coupled by the intermediate frequency 180° hybrid ring and amplified by the intermediate frequency low-noise amplifier, to output the intermediate frequency signal with the local oscillator noise suppressed.

Further, the two terahertz GaAs monolithic integrated subharmonic mixers each are formed by assembling a diode in a mixer circuit by using GaAs monolithic integration, thereby ensuring performance consistency of two mixer circuits.

Further, the terahertz GaAs monolithic integrated subharmonic mixer includes a radio frequency waveguide-suspended microstrip line transition, a radio frequency matching circuit, an anti-parallel diode pair, a local oscillator matching circuit, a local oscillator low-pass filter, a local oscillator waveguide-suspended microstrip line transition, an intermediate frequency low-pass filter, and an intermediate frequency output port arranged in sequence.

Further, the local oscillator frequency tripler includes an input waveguide, an input waveguide-microstrip line transition, an input low-pass filter, an input matching circuit, a same-directional-parallel diode pair, an output matching circuit, an output waveguide-microstrip line transition, and an output waveguide arranged in sequence.

The working principle of the GaAs monolithic integrated terahertz low-noise communication system transceiver front-end specifically includes: Radio frequency signals are filtered and coupled by a radio frequency 180° filter coupler into two signals with same power and a phase difference of 180°, which respectively enter corresponding terahertz GaAs monolithic integrated subharmonic mixers; a local oscillator signal is tripled by a local oscillator frequency tripler, and then inputted to a local oscillator co-directional 3 dB filter coupler, to be filtered and coupled into two local oscillator drive signals with same power and a same phase, which respectively enter the corresponding terahertz GaAs monolithic integrated subharmonic mixers to drive frequency mixing; two intermediate frequency components with a phase difference of 180° generated after the frequency mixing by the two terahertz GaAs monolithic integrated subharmonic mixers are respectively inputted to an intermediate frequency circuit on an upper layer for 180° coupling and amplification, and in this case, the two intermediate frequency components have a phase difference of 360° and are superposed co-directionally; and local oscillator noises of the two terahertz GaAs monolithic integrated subharmonic mixers fed from the local oscillator co-directional 3 dB filter coupler are phase-changed by 180° by the intermediate frequency circuit, to have a phase difference of 180° and be offset reversely, so that suppression of the local oscillator noise is implemented, thereby outputting an intermediate frequency signal with the local oscillator noise suppressed.

Compared with the prior art, the present disclosure has the following beneficial effects:

1. The present disclosure provides a GaAs monolithic integrated terahertz low-noise communication system transceiver front-end, which uses a two-layer circuit layout architecture, so that an intermediate frequency circuit is arranged on an upper layer of a terahertz circuit, thereby implementing integration and miniaturization of the entire circuit of the terahertz transceiver front-end.

2. In the terahertz low-noise communication system transceiver front-end, the present disclosure designs a novel local oscillator co-directional 3 dB filter coupler and a radio frequency 180° filter coupler, which have both signal coupling and filtering functions, so that local oscillator noises are suppressed while miniaturization is implemented, and that the problem of noise base deterioration of a local oscillator source after a plurality of frequency multiplications is solved, thereby achieving a low local oscillator noise suppressed transceiver front-end, and providing strong theoretical and technical support for implementing a terahertz high-speed communication system using high-order modulation.

3. The present disclosure reduces output ports of a circuit by adopting a method such as connecting a terahertz circuit and an intermediate frequency circuit by using a low-loss probe, thereby ensuring the realizability of the circuit.

DETAILED DESCRIPTION

The following describes the technical solutions of the present disclosure in detail with reference to the accompanying drawings and embodiments.

Embodiment 1

Figure 1:
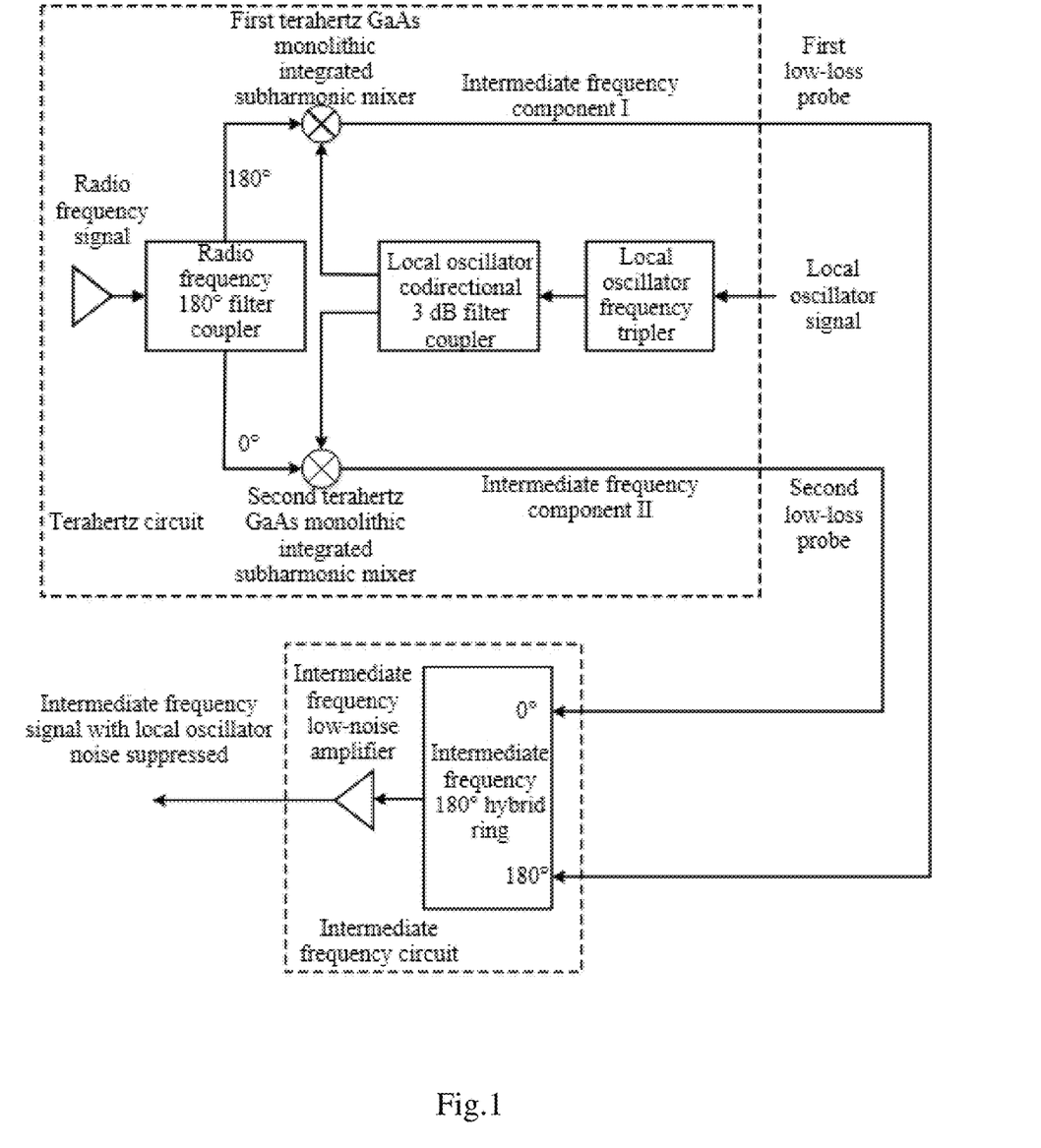
FIG. 1 is a schematic diagram of a circuit model of a GaAs monolithic integrated terahertz low-noise communication system transceiver front-end according to Embodiment 1 of the present disclosure.

This embodiment provides a GaAs monolithic integrated terahertz low-noise communication system transceiver front-end, as shown in FIG. 1, including a first low-loss probe, a second low-loss probe, an intermediate frequency circuit, and a terahertz circuit. The intermediate frequency circuit is arranged on an upper layer of the terahertz circuit, and the two circuits are connected by the first low-loss probe and the second low-loss probe, so that the terahertz low-noise communication system transceiver front-end is entirely integrated in a 30 mm×20 mm×20 mm circuit cavity, thereby achieving miniaturization of the transceiver front-end while ensuring the realizability of the circuit.

The terahertz circuit includes a local oscillator frequency tripler, a local oscillator co-directional 3 dB filter coupler, a first terahertz GaAs monolithic integrated subharmonic mixer, a second terahertz GaAs monolithic integrated subharmonic mixer, and a radio frequency 180° filter coupler. The intermediate frequency circuit includes an intermediate frequency 180° hybrid ring and an intermediate frequency low-noise amplifier arranged in sequence.

Figure 2:
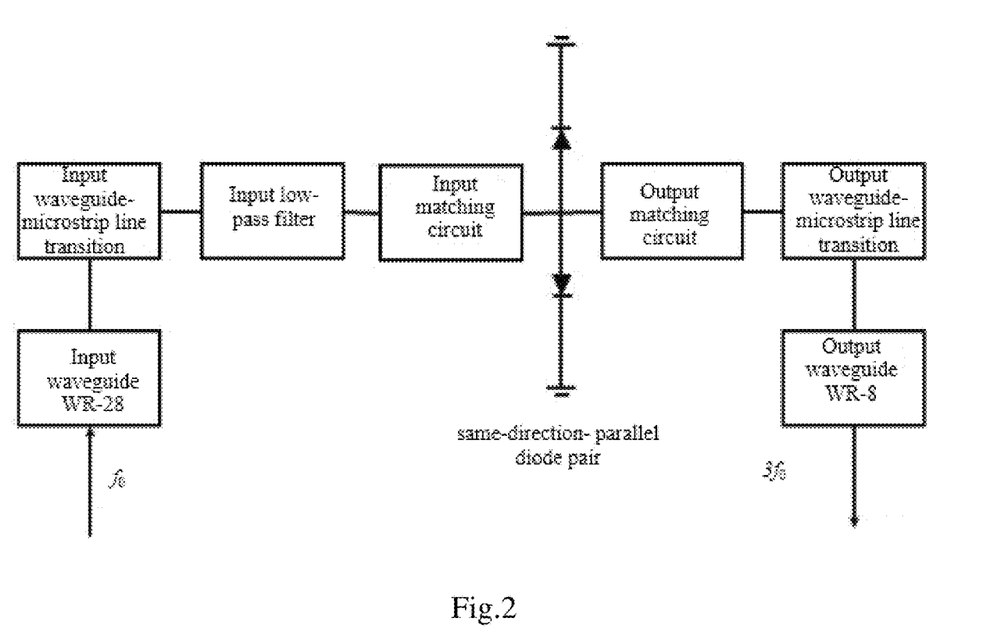
FIG. 2 is a schematic diagram of a circuit structure of a local oscillator frequency tripler according to Embodiment 1 of the present disclosure.

As shown in FIG. 2, the local oscillator frequency tripler includes an input waveguide WR-28, an input waveguide-microstrip line transition, an input low-pass filter, an input matching circuit, a same-directional-parallel diode pair, an output matching circuit, an output waveguide-microstrip line transition, and an output waveguide WR-8 arranged in sequence. A local oscillator signal at a frequency f0 is inputted from the input waveguide WR-28 of the local oscillator frequency tripler, and then inputted, through the input waveguide-microstrip line transition, the input low-pass filter, and the input matching circuit, to the same-directional-parallel diode pair for frequency tripling, and the signal after the frequency tripling passes through the output matching circuit and the output waveguide-microstrip line transition, to output a local oscillator frequency tripled signal at a frequency 3f0 through the output waveguide WR-8. The input matching circuit and the output matching circuit are designed based on a load traction method, so that an input signal enters the same-directional-parallel diode pair with maximum energy to participate in frequency multiplication, and then is outputted with maximum energy after the frequency multiplication, where the input waveguide-microstrip line transition is a transition used for receiving the local oscillator signal though the input waveguide WR-28 and sending the local oscillator signal to the input low-pass filter, and the output waveguide-microstrip line transition is a transition used for connecting the local oscillator co-directional 3 dB filter coupler and the output matching circuit, where the output waveguide-microstrip line transition is connected to the local oscillator co-directional 3 dB filter coupler through the output waveguide WR-8. For the incapability of the same-directional-parallel diode pair in suppressing an even-order harmonic component, waveguide reduction processing is performed on the output waveguide-microstrip line transition, to increase a cut-off frequency of the output port of the output waveguide-microstrip line transition, thereby effectively preventing leakage of a third harmonic component.

Figure 3:
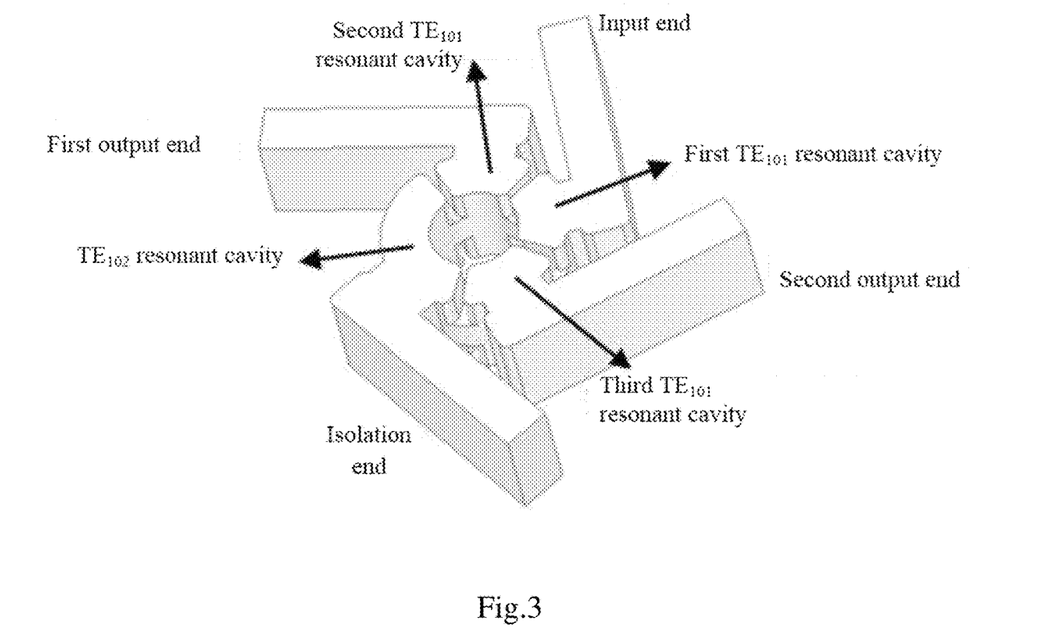
FIG. 3 is a schematic diagram of a structure of a local oscillator co-directional 3 dB filter coupler according to Embodiment 1 of the present disclosure.

The local oscillator co-directional 3 dB filter coupler and the radio frequency 180° filter coupler each include one ring-cylindrical resonant cavity and four rectangular waveguides. A height and a ring width of the ring-cylindrical resonant cavity are respectively equal to a long edge size and a short edge size of each of the rectangular waveguides, and an annular surface on both sides of the ring-cylindrical resonant cavity is provided with four corresponding sector-annular grooves, so that the ring-cylindrical resonant cavity is divided into a first TE101 resonant cavity, a second TE101 resonant cavity, a TE102 resonant cavity, and a third TE101 resonant cavity in sequence. Central angles of the first TE101 resonant cavity, the second TE101 resonant cavity, and the third TE101 resonant cavity are equal, and a central angle of the TE102 resonant cavity is twice of that of the first TE101 resonant cavity, the second TE101 resonant cavity, or the third TE101 resonant cavity. That's to say, in this embodiment, the ring-cylindrical resonant cavity is divided into four sector-annular resonant cavities comprising one big sector-annular resonant cavity and three small sector-annular resonant cavities, where the big sector-annular resonant cavity is the first TE101 resonant cavity and three small sector-annular resonant cavities refer to the first TE101 resonant cavity, the TE102 resonant cavity and the third TE101 resonant cavity. The four rectangular waveguides are correspondingly connected to the first TE101 resonant cavity, the second TE101 resonant cavity, the TE102 resonant cavity, and the third TE101 resonant cavity, respectively. The rectangular waveguide connected to the TE102 resonant cavity is connected to a ¼ section of an outer arc of the TE102 resonant cavity, and the rest rectangular waveguides, that is, the rectangular waveguides that are respectively connected to the first TE101 resonant cavity, the second TE101 resonant cavity, and the third TE101 resonant cavity, are connected to centers of outer arcs of the corresponding resonant cavities (the first TE101 resonant cavity, the second TE101 resonant cavity, and the third TE101 resonant cavity).

The rectangular waveguides of the local oscillator co-directional 3 dB filter coupler are standard waveguides WR-8, a groove depth of each sector-annular groove is 0.33 mm, and a distance between two end points of an outer arc of the sector-annular groove is 0.22 mm. As shown in FIG. 3, the local oscillator co-directional 3 dB filter coupler takes the rectangular waveguide that is connected to the first TE101 resonant cavity as an input end, the rectangular waveguide that is connected to the TE102 resonant cavity as an isolation end, and the rectangular waveguide that is connected to the second TE101 resonant cavity and the rectangular waveguide that is connected to the third TE101 resonant cavity as output ends (a first output end and a second output end). A local oscillator frequency tripled signal outputted from the local oscillator frequency tripler enters the input end of the local oscillator co-directional 3 dB filter coupler, with noise filtered through the grooves, to output two local oscillator drive signals with same power and a same phase from the two output ends, respectively, and in this case, anti-phase offset occurs at the isolation end due to a phase difference of 180°, and no signal is outputted therefrom.

Figure 5:
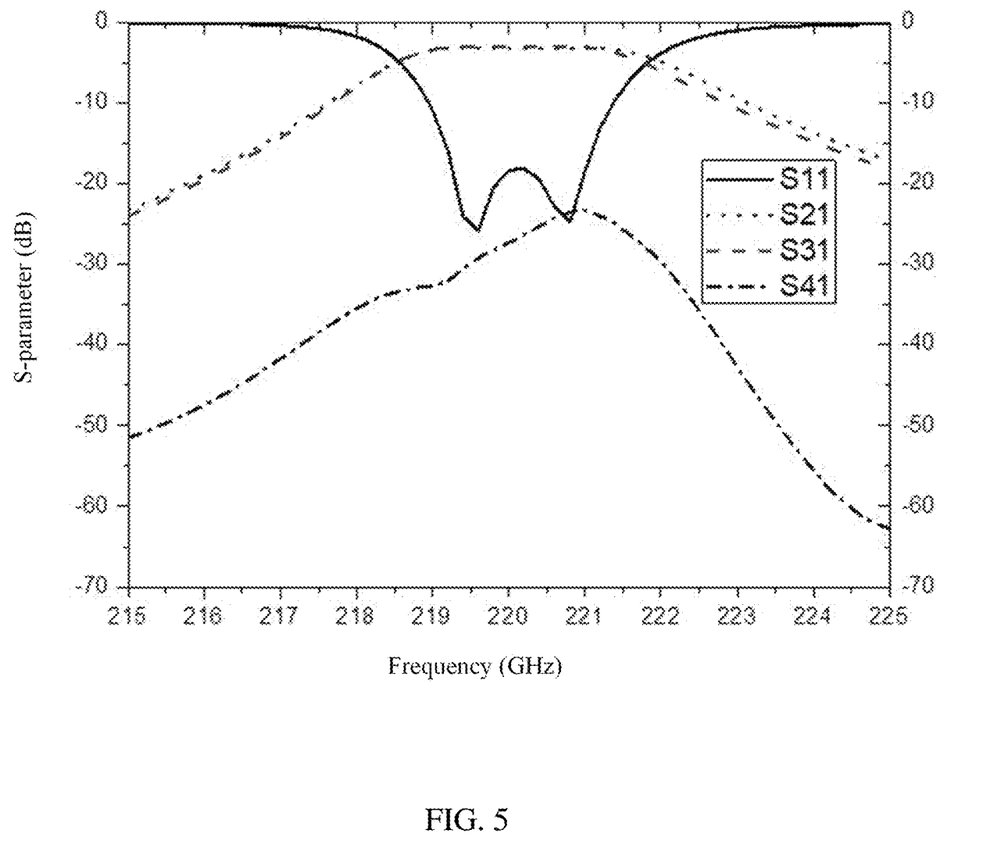
FIG. 5 illustrates a result of S-parameter simulation of the local oscillator co-directional 3 dB filter coupler according to Embodiment 1 of the present disclosure.
Figure 6:
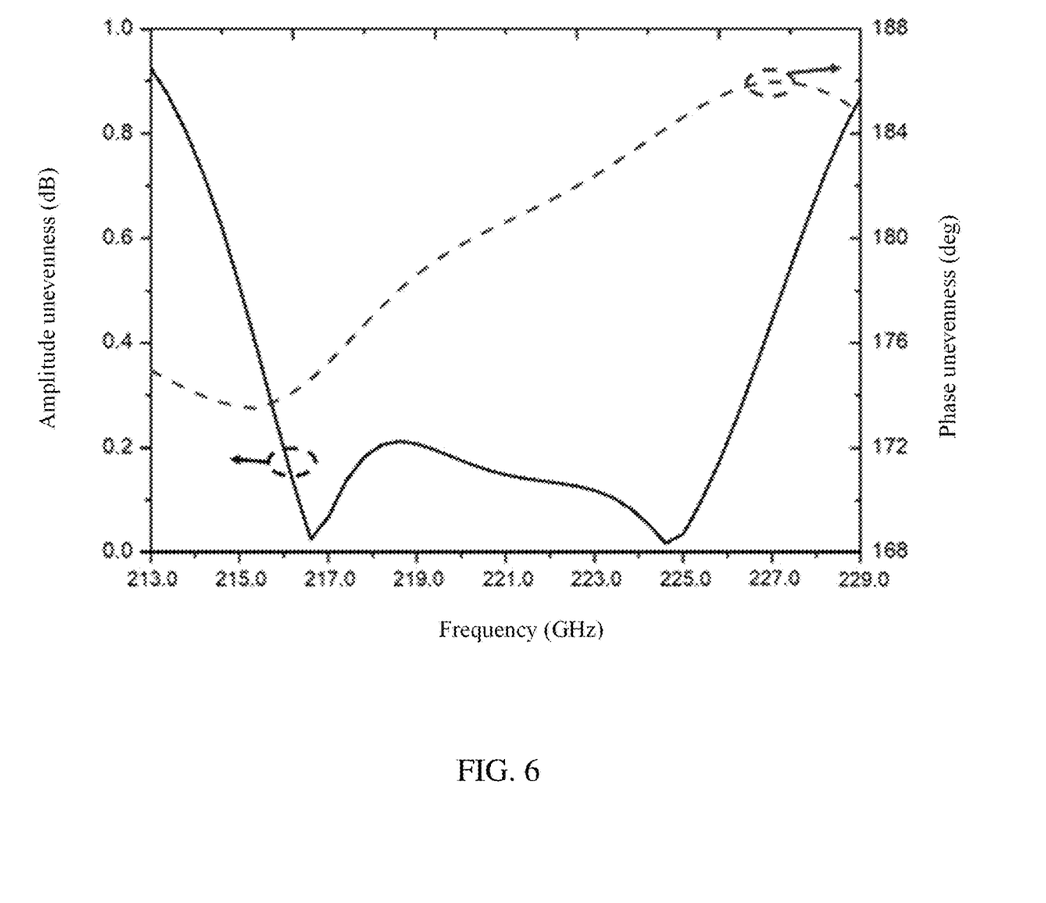
FIG. 6 illustrates simulation results of amplitude unevenness and phase unevenness of the signal outputted by the local oscillator co-directional 3 dB filter coupler according to Embodiment 1 of the present disclosure.

A result of S-parameter simulation of the local oscillator co-directional 3 dB filter coupler is illustrated in FIG. 5. It can be learned that at a position near a radio frequency signal at 220 GHz, a return loss S11 is better than −20 dB. In combination with simulation results of amplitude unevenness and phase unevenness illustrated in FIG. 6, it can be learned that the amplitude unevenness of the two local oscillator drive signals outputted from the two output ports is less than 0.2 dB, and compared with the phase difference of 180°, the phase unevenness is less than 3°, which demonstrate excellent performance.

The rectangular waveguides of the radio frequency 180° filter coupler are standard waveguides WR-5, a groove depth of each sector-annular groove is 0.17 mm, and a distance between two end points of an outer arc of the sector-annular groove is 0.12 mm. The radio frequency 180° filter coupler takes the rectangular waveguide that is connected to the TE102 resonant cavity as an input end, the rectangular waveguide that is connected to the first TE101 resonant cavity as an isolation end, and the rectangular waveguide that is connected to the second TE101 resonant cavity and the rectangular waveguide connected to the third TE101 resonant cavity as output ends. Radio frequency signals enter from the input end of the radio frequency 180° filter coupler, with noise filtered through the grooves, to output two signals with same power and a phase difference of 180° from the two output ends, respectively, and in this case, anti-phase offset occurs at the isolation end due to the phase difference of 180°, and no signal is outputted therefrom.

Figure 4:
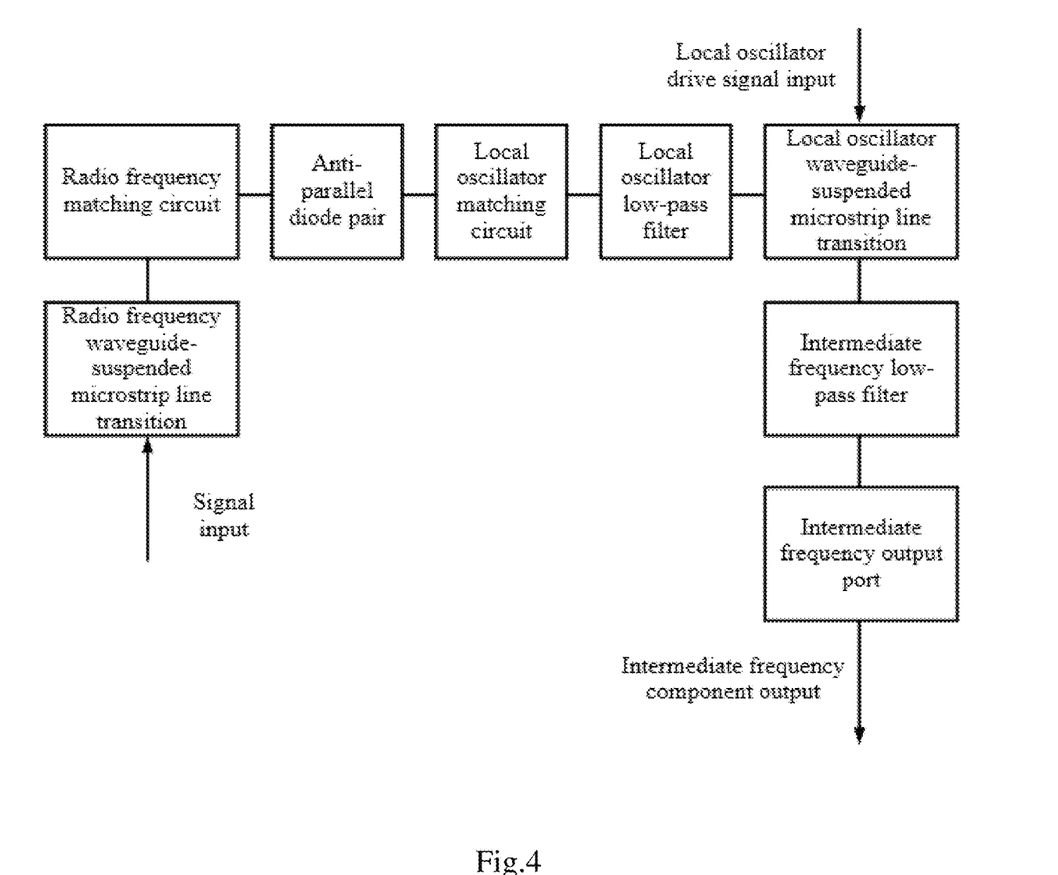
FIG. 4 is a schematic diagram of a circuit structure of a first terahertz GaAs monolithic integrated subharmonic mixer and a second terahertz GaAs monolithic integrated subharmonic mixer according to Embodiment 1 of the present disclosure.

As shown in FIG. 4, the first terahertz GaAs monolithic integrated subharmonic mixer and the second terahertz GaAs monolithic integrated subharmonic mixer are balanced circuit structures, each of which is formed by assembling a diode in a mixer circuit by using GaAs monolithic integration, thereby ensuring performance consistency of two mixer circuits. The first terahertz GaAs monolithic integrated subharmonic mixer and the second terahertz GaAs monolithic integrated subharmonic mixer each include a radio frequency waveguide-suspended microstrip line transition, a radio frequency matching circuit, an anti-parallel diode pair, a local oscillator matching circuit, a local oscillator low-pass filter, a local oscillator waveguide-suspended microstrip line transition, an intermediate frequency low-pass filter, and an intermediate frequency output port. A signal outputted by the radio frequency 180° filter coupler enters the radio frequency waveguide-suspended microstrip line transition, and passes through the radio frequency matching circuit, to enter the anti-parallel diode pair. A local oscillator drive signal outputted by the local oscillator co-directional 3 dB filter coupler enters the local oscillator waveguide-suspended microstrip line transition, and passes through the local oscillator low-pass filter and the local oscillator matching circuit, to enter the anti-parallel diode pair to drive frequency mixing. The radio frequency signal and the local oscillator drive signal are mixed in the anti-parallel diode pair, to produce intermediate frequency components, which then pass through the local oscillator matching circuit, the local oscillator low-pass filter, the local oscillator waveguide-suspended microstrip line transition, and the intermediate frequency low-pass filter, to be outputted from the intermediate frequency output port. The radio frequency waveguide-suspended microstrip line transition is a transition used for connecting the radio frequency 180° filter coupler and the radio frequency matching circuit, receiving the radio frequency signal and sending the radio frequency signal to the frequency matching circuit; the local oscillator waveguide-suspended microstrip line transition is a transition used for connecting the local oscillator co-directional 3 dB filter coupler, the local oscillator low-pass filter and the intermediate frequency low-pass filter.

The working principle of the GaAs monolithic integrated terahertz low-noise communication system transceiver front-end of this embodiment includes: Radio frequency signals are filtered and coupled by the radio frequency 180° filter coupler into two signals with same power and a phase difference of 180°, which respectively enter the first terahertz GaAs monolithic integrated subharmonic mixer and the second terahertz GaAs monolithic integrated subharmonic mixer; a local oscillator signal at a frequency f0 is tripled by the local oscillator frequency tripler to obtain a local oscillator frequency tripled signal at a frequency 3f0, which is then inputted to the local oscillator co-directional 3 dB filter coupler for filtering and coupling, thereby effectively reducing noise base after a plurality of frequency multiplications, and further alleviating noise at the transceiver front-end, and two local oscillator drive signals with same power and a same phase are outputted, to respectively enter the first terahertz GaAs monolithic integrated subharmonic mixer and the second terahertz GaAs monolithic integrated subharmonic mixer to drive frequency mixing; two intermediate frequency components (respectively an intermediate frequency component I and an intermediate frequency component II) with a phase difference of 180° generated after the frequency mixing by the first terahertz GaAs monolithic integrated subharmonic mixer and the second terahertz GaAs monolithic integrated subharmonic mixer are inputted through the first low-loss probe and the second low-loss probe respectively to the intermediate frequency 180° hybrid ring of the intermediate frequency circuit on the upper layer for coupling; in this case, the two intermediate frequency components with the phase difference of 180°, after being phase-changed by the intermediate frequency 180° hybrid ring, have a phase difference of 360°, and therefore are superimposed co-directionally, which is then amplified by the intermediate frequency low-noise amplifier, to output an intermediate frequency signal with local oscillator noise suppressed; in addition, the local oscillator noise fed from the local oscillator co-directional 3 dB filter coupler to the first terahertz GaAs monolithic integrated subharmonic mixer 3-1 and the second terahertz GaAs monolithic integrated subharmonic mixer 3-2 is phase-changed by the intermediate frequency 180° hybrid ring, to have a phase difference of 180°, and therefore is offset reversely, thereby achieving suppression of the local oscillator noise.

What is claimed is:

1. A GaAs monolithic integrated terahertz low-noise communication system transceiver front-end, comprising an intermediate frequency circuit and a terahertz circuit arranged up and down, wherein the terahertz circuit comprises a local oscillator frequency tripler, a local oscillator co-directional 3 dB filter coupler, a radio frequency 180° filter coupler, and two terahertz GaAs monolithic integrated subharmonic mixers;

the local oscillator co-directional 3 dB filter coupler and the radio frequency 180° filter coupler each comprise one ring-cylindrical resonant cavity and four rectangular waveguides, a height and a ring width of the ring-cylindrical resonant cavity are respectively equal to a long edge size and a short edge size of each of the rectangular waveguides, and an annular surface on both sides of the ring-cylindrical resonant cavity is provided with four corresponding sector-annular grooves, so that the ring-cylindrical resonant cavity is divided into four sector-annular resonant cavities comprising one big sector-annular resonant cavity and three small sector-annular resonant cavities, and a central angle of the big sector-annular resonant cavity is twice that of each small sector-annular resonant cavity; the four rectangular waveguides are correspondingly connected to the four sector-annular resonant cavities, respectively;

the local oscillator co-directional 3 dB filter coupler takes a rectangular waveguide of the four rectangular waveguides that is connected to the big sector-annular resonant cavity as an isolation end, and the radio frequency 180° filter coupler takes the rectangular waveguide that is connected to the big sector-annular resonant cavity as an input end;

radio frequency signals are filtered and coupled by the radio frequency 180° filter coupler into two signals, which respectively enter the corresponding terahertz GaAs monolithic integrated subharmonic mixers; a local oscillator signal is tripled by the local oscillator frequency tripler, and then inputted to the local oscillator co-directional 3 dB filter coupler, to be filtered and coupled into two local oscillator drive signals, which respectively enter the corresponding terahertz GaAs monolithic integrated subharmonic mixers to drive frequency mixing; and intermediate frequency components generated after the frequency mixing by the two terahertz GaAs monolithic integrated subharmonic mixer are separately inputted to the intermediate frequency circuit, 180° coupled and amplified, to output an intermediate frequency signal with local oscillator noise suppressed.

2. The GaAs monolithic integrated terahertz low-noise communication system transceiver front-end according to claim 1, wherein the intermediate frequency circuit and the terahertz circuit are connected by two low-loss probes.

3. The GaAs monolithic integrated terahertz low-noise communication system transceiver front-end according to claim 1, wherein a groove depth of the sector-annular groove does not exceed ⅓ of the long edge size of each of the rectangular waveguides, and a distance between two end points of an outer arc of the sector-annular groove does not exceed the short edge size of each of the rectangular waveguides.

4. The GaAs monolithic integrated terahertz low-noise communication system transceiver front-end according to claim 1, wherein the rectangular waveguides connected to the small sector-annular resonant cavities each are connected to a center of an outer arc of the corresponding small sector-annular resonant cavity.

5. The GaAs monolithic integrated terahertz low-noise communication system transceiver front-end according to claim 1, wherein the rectangular waveguide connected to the big sector-annular resonant cavity is connected to a ¼ section of an outer arc of the big sector-annular resonant cavity.

6. The GaAs monolithic integrated terahertz low-noise communication system transceiver front-end according to claim 1, wherein the intermediate frequency circuit comprises an intermediate frequency 180° hybrid ring and an intermediate frequency low-noise amplifier arranged in sequence, and the intermediate frequency components generated after the frequency mixing by the two terahertz GaAs monolithic integrated subharmonic mixers are coupled by the intermediate frequency 180° hybrid ring and amplified by the intermediate frequency low-noise amplifier, to output the intermediate frequency signal with the local oscillator noise suppressed.

7. The GaAs monolithic integrated terahertz low-noise communication system transceiver front-end according to claim 1, wherein the terahertz GaAs monolithic integrated subharmonic mixer comprises a radio frequency waveguide-suspended microstrip line transition, a radio frequency matching circuit, an anti-parallel diode pair, a local oscillator matching circuit, a local oscillator low-pass filter, a local oscillator waveguide-suspended microstrip line transition, an intermediate frequency low-pass filter, and an intermediate frequency output port arranged in sequence.

* * * * *